United States Patent
Zeng

(10) Patent No.: US 11,064,061 B2
(45) Date of Patent: Jul. 13, 2021

(54) MOBILE TERMINAL SHELL FOR ENHANCING ANTENNA SLOT MECHANICAL PROPERTIES AND APPEARANCE

(71) Applicant: GUANGDONG OPPO MOBILE TELECOMMUNICATIONS CORP., LTD., Guangdong (CN)

(72) Inventor: Yuanqing Zeng, Dongguan (CN)

(73) Assignee: GUANGDONG OPPO MOBILE TELECOMMUNICATIONS CORP., LTD., Guangdong (CN)

( * ) Notice: Subject to any disclaimer, the term of this patent is extended or adjusted under 35 U.S.C. 154(b) by 0 days.

(21) Appl. No.: 16/620,844

(22) PCT Filed: Jun. 15, 2018

(86) PCT No.: PCT/CN2018/091489
§ 371 (c)(1),
(2) Date: Dec. 9, 2019

(87) PCT Pub. No.: WO2019/011104
PCT Pub. Date: Jan. 17, 2019

(65) Prior Publication Data
US 2020/0128117 A1 Apr. 23, 2020

(30) Foreign Application Priority Data
Jul. 13, 2017 (CN) .......................... 201710571118.3

(51) Int. Cl.
*H04M 1/02* (2006.01)
*B81C 1/00* (2006.01)
(Continued)

(52) U.S. Cl.
CPC ......... *H04M 1/0249* (2013.01); *B81C 1/0046* (2013.01); *H01Q 1/243* (2013.01);
(Continued)

(58) Field of Classification Search
CPC ...... H05K 5/0217; H05K 5/0243; H05K 5/04; B81C 1/0046; B82Y 30/00; H04B 1/3888
See application file for complete search history.

(56) References Cited

U.S. PATENT DOCUMENTS 10,827,047 B2 * 11/2020 Li ........................ B32B 38/145
2007/0155445 A1 7/2007 Cho et al.
(Continued)

FOREIGN PATENT DOCUMENTS

| CN | 102076189 A | 5/2011 |
| CN | 103930465 A | 7/2014 |

(Continued)

OTHER PUBLICATIONS

A Supplementary European Search Report (SESR) dated Apr. 6, 2020 for Application No. EP 18831514.7.
(Continued)

*Primary Examiner* — Devan A Sandiford
(74) *Attorney, Agent, or Firm* — Ladas & Parry LLP

(57) ABSTRACT

The present application provides a mobile terminal shell, a preparation method, and a mobile terminal. The mobile terminal shell comprises: a substrate made of metal; an enhanced part provided on at least a part of the surface of one side of the substrate and made of a first material; an antenna slot provided on the substrate and filled with a second material, wherein the strength of the first material is higher than the strength of the second material.

19 Claims, 9 Drawing Sheets

(51) Int. Cl.
   *H01Q 1/24*    (2006.01)
   *H01Q 13/10*   (2006.01)
   *H04B 1/3888*  (2015.01)
   *H05K 5/02*    (2006.01)
   *H05K 5/04*    (2006.01)
   *B82Y 30/00*   (2011.01)

(52) U.S. Cl.
   CPC ......... *H01Q 13/106* (2013.01); *H04B 1/3888* (2013.01); *H05K 5/0217* (2013.01); *H05K 5/04* (2013.01); *B82Y 30/00* (2013.01)

(56) References Cited

U.S. PATENT DOCUMENTS

| | | | |
|---|---|---|---|
| 2012/0178382 A1 | 7/2012 | Merz | |
| 2014/0098502 A1* | 4/2014 | Lasarov | H04M 1/0283 361/752 |
| 2014/0125528 A1 | 5/2014 | Tsai et al. | |
| 2014/0266926 A1 | 9/2014 | Merz et al. | |
| 2015/0111623 A1* | 4/2015 | Hegemier | B44C 1/105 455/575.1 |
| 2016/0112551 A1* | 4/2016 | Hung | H04B 1/3833 455/575.7 |
| 2016/0269513 A1 | 9/2016 | Hiroki et al. | |
| 2016/0308271 A1* | 10/2016 | Jin | H04B 1/3888 |
| 2017/0149118 A1* | 5/2017 | Wang | H01Q 1/243 |
| 2017/0256845 A1 | 9/2017 | Tsai et al. | |
| 2017/0256846 A1 | 9/2017 | Tsai et al. | |
| 2017/0331173 A1* | 11/2017 | Ju | H01Q 7/06 |
| 2017/0346162 A1* | 11/2017 | Han | H01Q 1/243 |
| 2018/0036961 A1* | 2/2018 | Li | B22F 9/20 |
| 2018/0041238 A1* | 2/2018 | Jiang | B32B 15/20 |
| 2018/0053989 A1* | 2/2018 | Ma | H04M 1/0283 |
| 2018/0090819 A1* | 3/2018 | Wang | H01Q 1/44 |
| 2018/0375971 A1* | 12/2018 | Sun | H01Q 1/243 |
| 2019/0089039 A1 | 3/2019 | Ma et al. | |
| 2019/0165453 A1 | 5/2019 | Tsai et al. | |
| 2019/0342431 A1* | 11/2019 | Li | H01Q 1/243 |
| 2019/0386381 A1 | 12/2019 | Tsai et al. | |
| 2020/0052386 A1 | 2/2020 | Tsai et al. | |

FOREIGN PATENT DOCUMENTS

| | | |
|---|---|---|
| CN | 104538735 A | 4/2015 |
| CN | 104540341 A | 4/2015 |
| CN | 104850188 A | 8/2015 |
| CN | 105530784 A | 4/2016 |
| CN | 105556934 A | 5/2016 |
| CN | 105635358 A | 6/2016 |
| CN | 105722347 A | 6/2016 |
| CN | 105960131 A | 9/2016 |
| CN | 106102389 A | 11/2016 |
| CN | 106211686 A | 12/2016 |
| CN | 106785344 A | 5/2017 |
| CN | 106816687 A | 6/2017 |
| CN | 107257605 A | 10/2017 |
| EP | 1804469 A2 | 7/2007 |
| KR | 20120058477 A | 6/2012 |
| WO | 2011067067 A1 | 6/2011 |

OTHER PUBLICATIONS

An Indian Office Action with an English translation dated Jun. 25, 2020 for Application No. IN 201917051252, and references cited therein.
Supplementary European Search Report in the European application No. 18831514.7, dated Apr. 6, 2020.
Office Action of the Indian application No. 201917051252, dated Jun. 25, 2020.
An International Search Report (ISR) and Written Opinion (WO) dated Sep. 7, 2018 for Application No. PCT/CN2018/091489.
A first Chinese Office Action with an English translation dated Mar. 12, 2019 for Application No. CN 201710571118.3, and references cited therein.
International Search Report in the international application No. PCT/CN2018/091489, dated Sep. 7, 2018.
Written Opinion of the International Search Authority in the international application No. PCT/CN2018/091489, dated Sep. 7, 2018.
First Office Action of the Chinese application No. 201710571118.3, dated Mar. 12, 2019.

* cited by examiner

MOBILE TERMINAL SHELL FOR ENHANCING ANTENNA SLOT MECHANICAL PROPERTIES AND APPEARANCE

RELATED APPLICATION

This application is an application under 35 U.S.C. 371 of International Application No. PCT/CN2018/091489 filed on Jun. 15, 2018, the entire contents of which are incorporated herein by reference.

TECHNICAL FIELD

The present application relates to the field of manufacture of electronic devices, and in particular to a mobile terminal shell, a manufacturing method and a mobile terminal.

BACKGROUND

Metal shells are increasingly used in mobile terminals such as mobile phones due to good mechanical properties and good texture appearance. For example, in current mobile phones, back covers or integrated shells formed of metal such as an aluminum alloy are often used. However, since the whole metal block may cause shielding of a communication signal, when a mobile terminal shell is made of metal, an antenna slot is required to be provided on the shell and filled with an insulating material such as plastic to realize a communication function of the mobile terminal.

However, current mobile terminal shells, manufacturing methods and mobile terminals still need to be improved.

SUMMARY

The present application provides a mobile terminal shell. According to embodiments of the present application, the mobile terminal shell may include: a body formed of metal; a reinforcing portion provided on at least a part of the surface on one side of the body and formed of a first material, and an antenna slot provided on the body and filled with a second material. The strength of the first material may be higher than the strength of the second material. The mobile terminal shell may balance the uniformity of appearance and the overall mechanical properties of the shell.

In another aspect of the present application, the present application provides a method for manufacturing a mobile terminal shell. The method may include: performing first nano molding processing on one side of a body, to form a reinforcing portion on one side of the body; and performing second nano molding processing on the other side of the body, to fill an antenna slot on the body. The first nano molding processing may be performed by using a first material, and the second nano molding processing may be performed by using a second material, the strength of the first material being higher than the strength of the second material. Therefore, it is possible to easily obtain a shell having both mechanical properties and uniform appearance.

In still another aspect of the present application, the present application provides a mobile terminal. According to the embodiments of the present application, the mobile terminal may include the foregoing mobile terminal shell. Therefore, the mobile terminal has all the features and advantages of the foregoing mobile terminal shell, and details are not described herein again.

LIST OF REFERENCE SYMBOLS

100: Mobile terminal shell; 110: body; 120: antenna slot; 130: reinforcing portion; 10: second material; 20: first material; 30: fixing portion; 1000: mobile terminal.

DETAILED DESCRIPTION

The embodiments of the present application are described in detail below, and the examples of the embodiments are illustrated in the accompanying drawings. The embodiments described below with reference to the drawings are intended to be illustrative of the present application and are not to be construed as limiting the present application.

Figure 1:
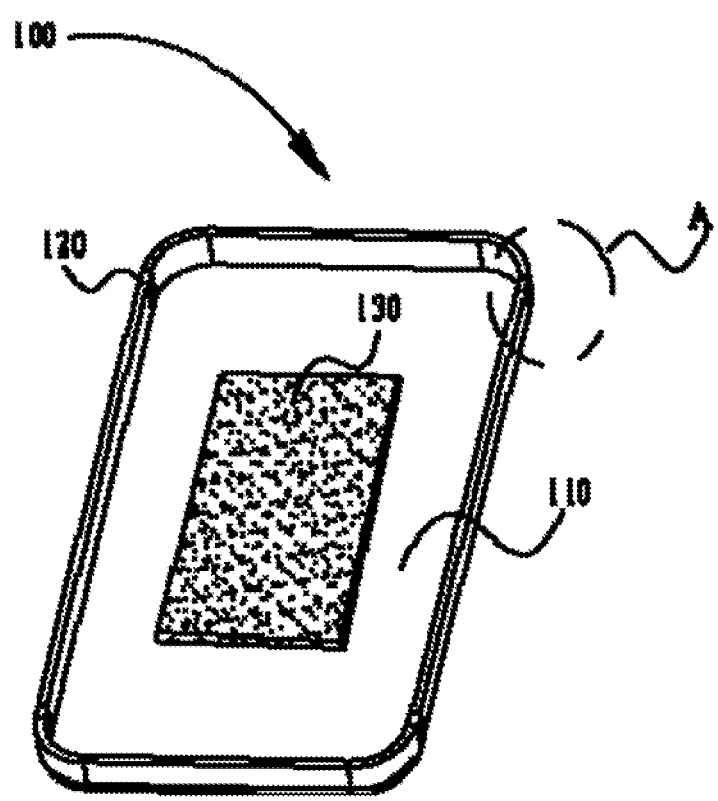
FIG. 1 illustrates a structural schematic diagram of a mobile terminal shell according to an embodiment of the present application.

In an aspect of the present application, the present application provides a mobile terminal shell. According to the embodiments of the present application, as illustrated in FIG. 1, the mobile terminal shell includes a body 110, a reinforcing portion 130 and an antenna slot 120. According to the embodiments of the present application, the body 110 is formed of metal. According to the embodiments of the present application, a specific material of the metal forming the both 110 is not particularly limited, and those skilled in the art may select according to actual needs. According to the embodiments of the present application, the reinforcing portion 130 is provided on at least a part of the surface on one side of the body 110, and the reinforcing portion 130 is formed of a first material 20. According to the embodiments of the present application, the antenna slot 120 is provided on the body 110, and the antenna slot 120 is filled with a second material 10. The strength of the first material 20 is higher than the strength of the second material 10. The mobile terminal shell may balance the uniformity of appearance and the overall mechanical properties of the shell.

According to the embodiments of the present application, the first material 20 and the second material 10 may be formed on the body 110 by a Nano Molding Technology (NMT). In order to facilitate understanding, the principle of achieving the above technical effects and the principle and process of injecting, the first material 20 and the second material 10 by the NMT are briefly described below.

The inventors have found that the current mobile terminal shell generally has the problems of inability to balance mechanical properties and the appearance since it is necessary to fill an insulating material in the antenna slot or an inner surface of the a shell. The inventors have conducted intensive research and a large number of experiments and found that this is mainly due to the need to enhance the mechanical strength of the filled insulating material if it is necessary to ensure the mechanical properties of the metal shell. The enhancement in the mechanical strength of the insulating material generally causes a decrease in the fluidity of the insulating material (such as polymer or plastic). Moreover, the enhancement of mechanical strength is often achieved by adding a reinforcing agent to the insulating material, and the addition of the reinforcing agent not only causes the fluidity of the insulating material to deteriorate, but also makes it difficult to make the appearance of the polymer after injection molding remain uniform with the metal shell. However, if the content of the reinforcing agent in the insulating material is reduced, although the antenna slot which is more uniform in appearance with the metal shell may be formed, the overall mechanical strength of the metal shell will also be significantly reduced. However, the mobile terminal shell provided in the present application may not only achieve the uniformity of appearance, but also have excellent overall mechanical properties, and thus the above problems may be largely solved.

Specifically, NMT processing is a method for combining metal and plastic by using a nano technology. Firstly, a metal surface is subjected to nano processing, and then, the plastic is directly molded on the metal surface. The method may simplify the design of a product component, the formed product is slimmer, and the production cost and the production efficiency are superior to those of a CNC process. For example, according to a specific embodiment of the present application, when manufacturing the mobile terminal shell, the NTF processing may be utilized twice to fill the antenna slot 120 with the first material 20 and the second material 10 respectively and to form the reinforcing portion 130. The strength of the first material 20 is higher than the strength of the second material 10. Therefore, the first material 20 having a large strength may be provided on inner side the body 110 (that is, the side of the mobile terminal shell 100 facing internal structures such as a main board, a memory; etc.), and the second material 10 having a strong fluidity may be provided on the other side of the body 110, that is, the outer side of the mobile terminal shell 100 (that is, appearance surface). Therefore, the large strength of the first material 20 may enhance the mechanical strength of the filled insulating material and ensure the mechanical properties of the body 110. Meanwhile, the strong fluidity of the second material 10 may make the appearance of the polymer after injection molding remain uniform with the metal shell. Therefore, it is possible to easily obtain the mobile terminal shell 100 having both mechanical properties and uniform appearance.

According to the embodiments of the present application, independently of one another, each of the second material 10 and the first material 20 is formed of plastic. Therefore, the production cost may be reduced. According to the embodiments of the present application, a specific component of the plastic forming the second material 10 and the first material 20 is not particularly limited, and those skilled in the art may select according to actual needs. For example, according to the embodiments of the present application, the first material 20 includes a first substrate and a first reinforcing agent. According to the embodiments of the present application, the second material 10 includes a second substrate and a second reinforcing agent. The content of the first reinforcing agent in the first material 20 is greater than the content of the second reinforcing agent in the second material 10. Therefore, the first material 20 having a higher reinforcing agent content may be utilized to ensure the mechanical properties of the metal shell, and the second material 10 having a lower reinforcing agent content may be utilized to obtain a better appearance effect.

According to the embodiments of the present application, a specific type of the second substrate and the first substrate is not particularly limited, and those skilled in the art may select according to actual needs. For example, according to the embodiments of the present application, independently of one another, each of the second substrate and the first substrate includes at least one of polybutylene terephthalate, polybutylene succinate, or polyamide. According to a specific embodiment of the present application, each of the second substrate and the first substrate includes one of the above components such as polybutylene terephthalate, or includes two of polybutylene terephthalate, polybutylene succinate and polyamide such as polybutylene terephthalate and polybutylene succinate, or includes polybutylene terephthalate, polybutylene butylene glycolate and polyamide. According to the embodiments of the present application, a specific type of the second reinforcing agent and the first reinforcing agent is not particularly limited, and those skilled in the art may select according to actual needs. For example, according to the embodiments of the present application, independently of one another, each of the second reinforcing agent and the first reinforcing agent includes at least one of a glass fiber, a carbon fiber, or a carbon nanotube. According to a specific embodiment of the present application, each of the second reinforcing agent and the first reinforcing agent includes one of the above components such as a glass fiber, or includes two of a glass fiber, a carbon fiber and a carbon nanotube such as a glass fiber and a carbon fiber, or includes a glass fiber, a carbon fiber and a carbon nanotube. The above materials are widely available and are easily obtained, which is advantageous for further reducing the production material cost of the mobile terminal shell.

According to the embodiments of the present application, the content of the second substrate is present at 70 wt % to 90 wt % of the mass of the second material 10. According to the embodiments of the present application, the content of the second reinforcing agent is present at 10 wt % to 30 wt % of the mass of the second material 10. When the content of the second substrate and the second reinforcing agent in the second material 10 is in the above range, the second material 10 may be made to have relatively good fluidity. According to the embodiments of the present application, the content of the first substrate is present at 40 wt % to 60 wt % of the mass of the first material 20. According to the embodiments of the present application, the content of the first reinforcing agent is present at 40 wt % to 60 wt % of the mass of the first material 20. Therefore, the overall mechanical properties of the metal shell may be ensured. For example, among the first material 20 and the second material 10, the first substrate and the second substrate may both the PBT, and the first reinforcing agent and the second reinforcing agent may both be glass fibers (GF). The second material 10 may contain glass fibers of no more than 20 wt %, and the first material 20 may contain the second reinforcing agent of more than 50 wt %.

Figure 4:
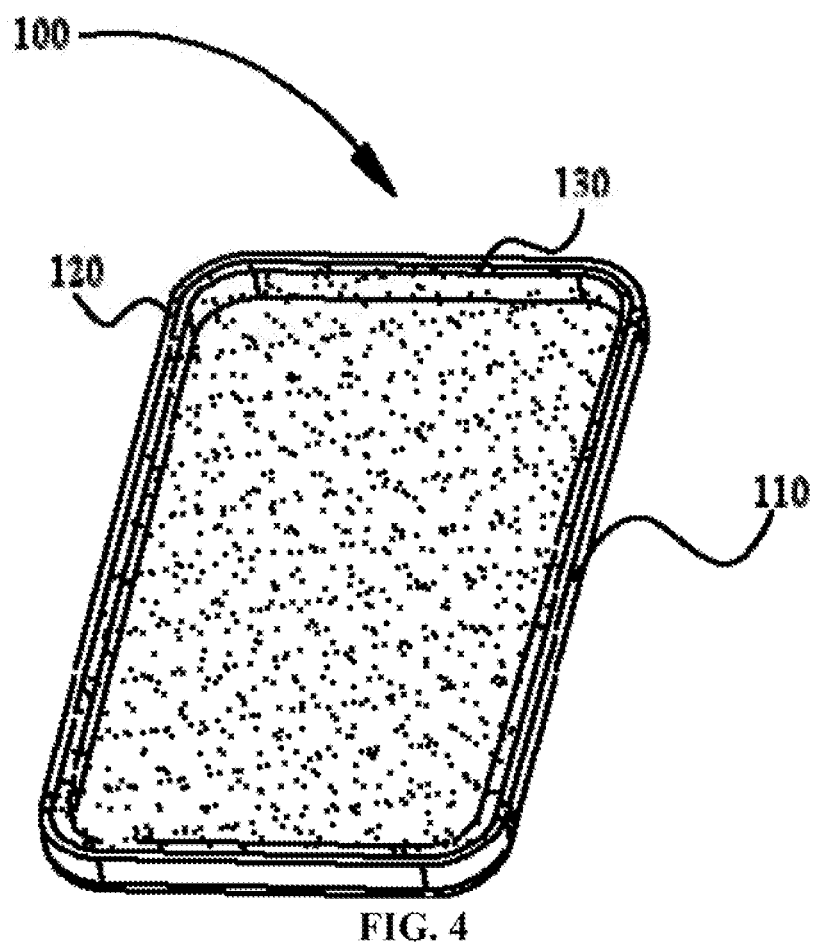
FIG. 4 illustrates a structural schematic diagram of a mobile terminal shell according to an embodiment of the present application.

According to the embodiments of the present application, as illustrated in FIG. 4, the reinforcing portion 130 covers the entire surface of one side of the body 110 away from the antenna slot 120. Therefore, the mechanical properties of the mobile terminal shell 100 may be further enhanced.

Figure 2:
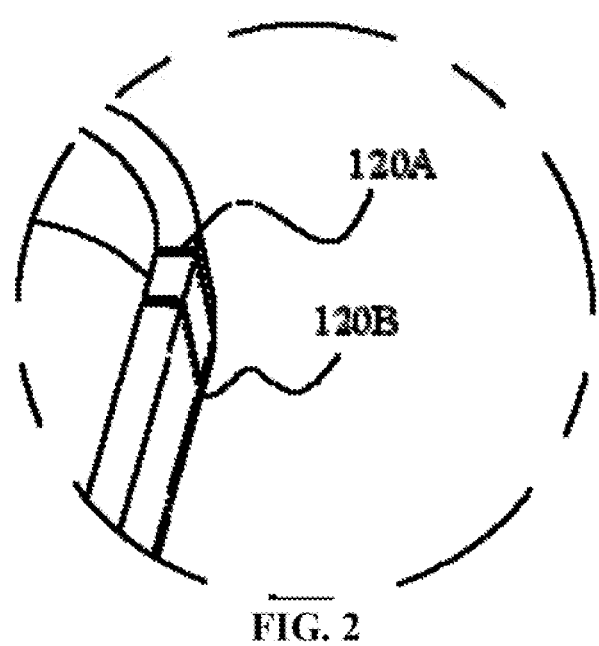
FIG. 2 illustrates an enlarged structural schematic diagram of a region A in FIG. 1.
Figure 3:
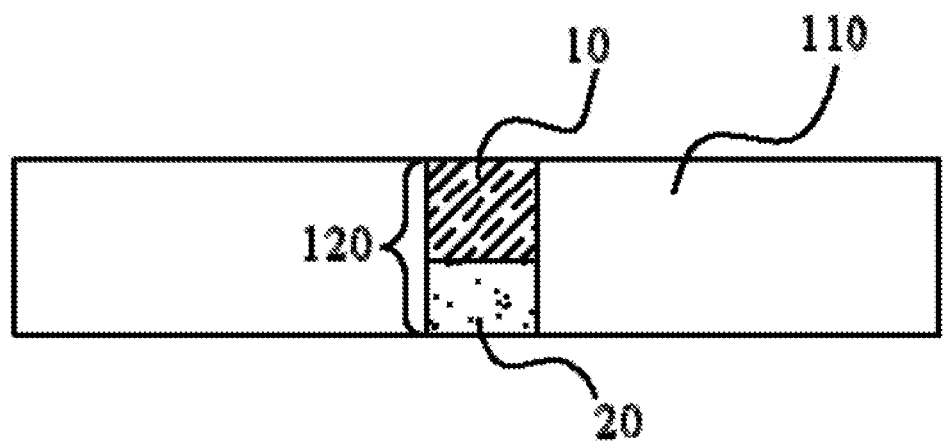
FIG. 3 illustrates a partial structural schematic diagram of a mobile terminal shell according to an embodiment of the present application.

According to the embodiments of the present application, as illustrated in FIG. 2 (a partial enlarged view of a region A in FIG. 1), the antenna slot 120 (shown as 120A and 120B in the figure) penetrates throughout the body 110. According to the embodiments of the present application, as illustrated in FIG. 3, the antenna slot 120 is filled with a second material 10 and a first material 20. According to the embodiments of the present application, the first material 20 is filled at a side adjacent to the reinforcing, portion 130. That is to say, the overall mechanical properties of the metal shell may be ensured by the filled position of the first material 20, and the appearance effect is not affected. According to the embodiments of the present application, the position where the second material 10 is filled may be the side of the antenna slot 120 in the mobile terminal shell 100 form the appearance, thereby enabling the mobile terminal shell 100 to obtain a better appearance effect. Moreover, the fluidity of the second material 10 is strong, and the performance of the mobile terminal shell may be further enhanced. In general, the mobile terminal shell 100 may balance the uniformity of appearance and the overall mechanical properties of the shell.

According to the embodiments of the present application, the mobile terminal shell 100 further includes a through hole. According to the embodiments of the present application, the through hole extends through the body 110. According to the embodiments of the present application, the through hole is surrounded by the reinforcing portion 130. Therefore, the mechanical properties of the through holes may be improved. According to the embodiments of the present application, a specific type, a setting position and a setting manner of the through hole are not particularly limited, and those skilled in the art may select according to actual needs. For example, according to the embodiments of the present application, the through hole may be at least one of a headphone jack and a charging hole. According to a specific embodiment of the present application, the through hole may be one of a headphone jack and a charging hole, or may have multiple through holes such as a headphone jack and a charging hole. Therefore, the arrangement of the structure such as the headphone jack and the charging hole may be realized.

Figure 5:
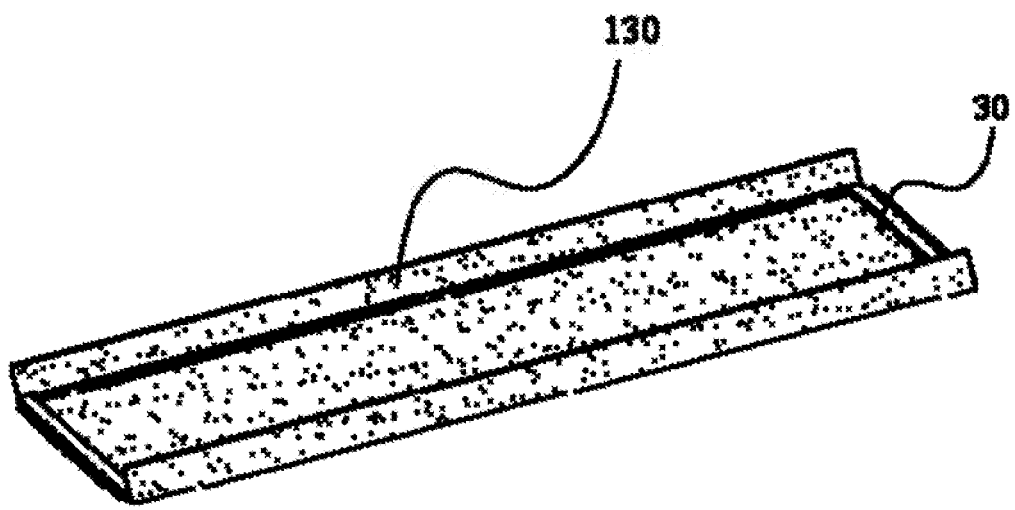
FIG. 5 illustrates a partial structural schematic diagram of a reinforcing portion according to an embodiment of the present application.

According to the embodiments of the present application, as illustrated in FIG. 5, the mobile terminal shell 100 further includes a fixing recess 30. According to the embodiments of the present application, the fixing recess 30 is formed by the reinforcing portion 130. Therefore, it may be configured to accommodate a battery, a mother board, etc., and is advantageous in enhancing the mechanical properties of the shell without significantly increasing the overall thickness of the mobile terminal.

In another aspect of the present application, the present application provides a method for manufacturing a mobile terminal shell. According to the embodiments of the present application, the method includes the following steps.

At S100, a reinforcing portion is formed.

In this step, first nano molding processing is performed on one side of a body, to form a reinforcing portion on one side of the body. According to the embodiments of the present application, the first nano molding processing is performed by using the first material. According to the embodiments of the present application, a specific type, components and the content of each component of the first material have been described in detail above and will not be described herein. In general, the formed reinforcing portion may enhance the mechanical properties of the shell.

According, to the embodiments of the present application, the area, on which the first nano molding processing on the surface of one side of the body is performed, is not particularly limited, and those skilled in the art may select according to actual needs. For example, according to the embodiments of the present application, the first nano molding processing is performed on the entire surface of one side of the body to form the reinforcing portion.

At S200, an antenna slot is filled.

In this step, second nano molding processing is performed on the other side of the body, to fill an antenna slot on the body. According to the embodiments of the present application, the second nano molding processing is performed by using the second material. According to the embodiments of the present application, the strength of the first material is higher than the strength of the second material. According to the embodiments of the present application, a specific type, components and the content of each component of the second material have been described in detail above and will not be described herein. In general, the filling of the antenna slot may further improve the performance of the shell, and the shell may obtain a better appearance effect. Therefore, it is possible to easily obtain a shell having both mechanical properties and uniform appearance. It can be understood by those skilled in the art that, in this step, the method further includes: an antenna slot penetrating throughout the body is pre-formed on the body. Therefore, the antenna slot may be easily obtained.

According, to the embodiments of the present application, the space in the antenna slot on the body filled with the second material is not particularly limited, and those skilled in the art may select according to actual needs. For example, according to the embodiments of the present application, the entire space of the antenna slot may be filled. According to the embodiments of the present application, as illustrated in FIG. 3, the first material may be filled in at least a part of the antenna slot to form an accommodating space on one side of the antenna slot away from the reinforcing portion, and the antenna slot is filled by second nano molding processing. Therefore, the shell may have both mechanical properties and uniform appearance.

According to the embodiments of the present application, in the method, the sequence of forming the reinforcing portion and filling the antenna slot is not particularly limited, and those skilled in the art may select according to actual needs. For example, according to the embodiments of the present application, as described above, the reinforcing portion may be first formed, and then the antenna slot may be filled. According to the embodiments of the present application, the antenna slot may be first filled, and then the reinforcing portion may be formed.

According to the embodiments of the present application, the specific positions for performing the first nano molding processing and the second nano molding processing are not particularly limited, as long as the first nano molding processing, may be utilized to form a reinforcing portion capable of enhancing the mechanical strength of the mobile terminal shell, and the second nano molding processing may be utilized to form an antenna slot (i.e., a second material filled on one side of the appearance surface of the antenna slot) that is uniform in appearance with metal.

For example, according to a specific embodiment of the present application, the first material may be filled in at least a part of the antenna slot. Therefore, the mechanical properties of the shell may be further improved. According to the specific embodiment of the present application, the step of filling the antenna slot firstly and then forming the reinforcing portion may be as follows.

Figure 6:
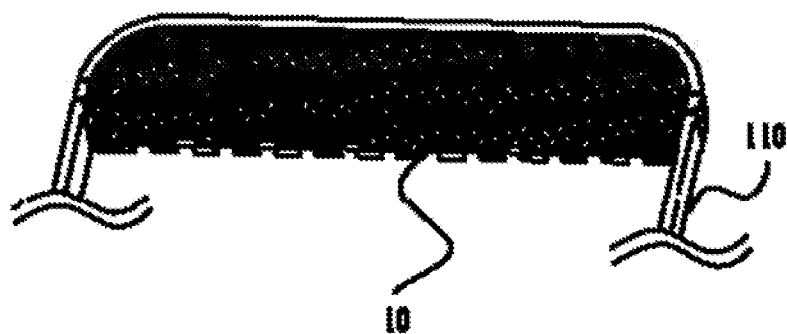
FIG. 6 illustrates a partial structural schematic diagram of a mobile terminal shell according to an embodiment of the present application.
Figure 6:
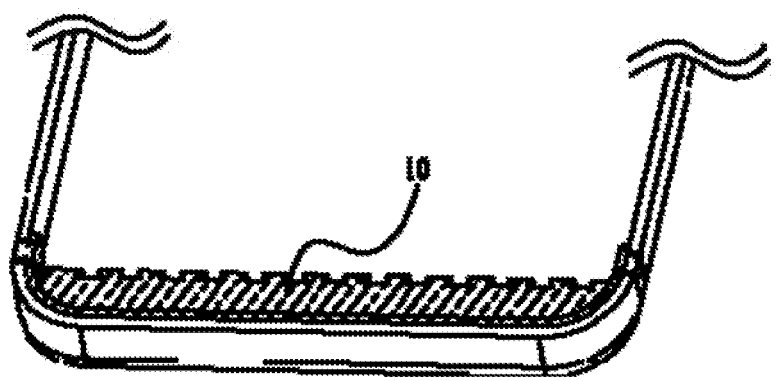
Figure 7:
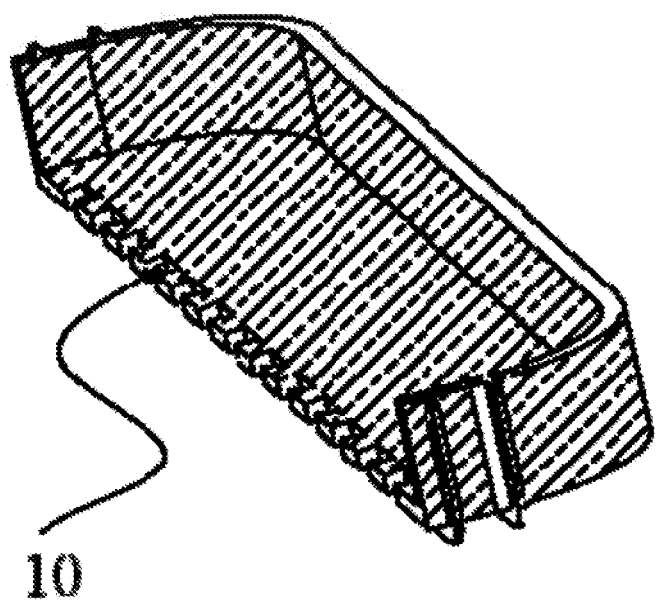
FIG. 7 illustrates a partial structural schematic diagram of a mobile terminal shell according to another embodiment of the present application.

The second material is filled in the antenna slot on the body by the second nano molding processing; and the first nano molding processing is performed on one side of the body away from the second material, to form the reinforcing portion. According to the embodiments of the present application, the specific steps of filling the antenna slot and forming the reinforcing: portion have been described in detail above, and will not be described herein again. It is to be noted that the specific area of the filled second material is not particularly limited, and those skilled in the art may select according to actual needs. For example, the entire space of the antenna slot may be filled. According to the embodiments of the present application, as illustrated in FIG. 6, the entire space of the antenna slot and a part of the space of one side of the body may be filled, and the structure of the filled second material is as shown in FIG. 7. According to the embodiments of the present application, a specific area for forming the reinforcing portion is not particularly limited, and those skilled in the art may select according to actual needs. For example, according to the embodiments of the present application, as illustrated in FIG. 8, the reinforcing portion may cover the remaining surface where the second material is not filled on one side of the body away from the antenna slot.

According to the embodiments of the present application, before performing the first nano molding processing, the method further includes: forming a through hole in the body. According to the embodiments of the present application, a specific type, a setting position and a setting manner of the through hole are not particularly limited, and those skilled in the art may select according to actual needs. For example, according to the embodiments of the present application, the through hole may be at least one of a headphone jack and a charging hole. According to a specific embodiment of the present application, the through hole may be one of a headphone jack and a charging hole, or the through hole may be a headphone jack and a charging hole. Therefore, the arrangement of the structure such as the headphone jack and the charging hole may be realized. According to the embodiments of the present application, the reinforcing portion is formed around the through hole by the first nano molding processing. Therefore, the mechanical properties of the through holes may be improved.

Figure 8:
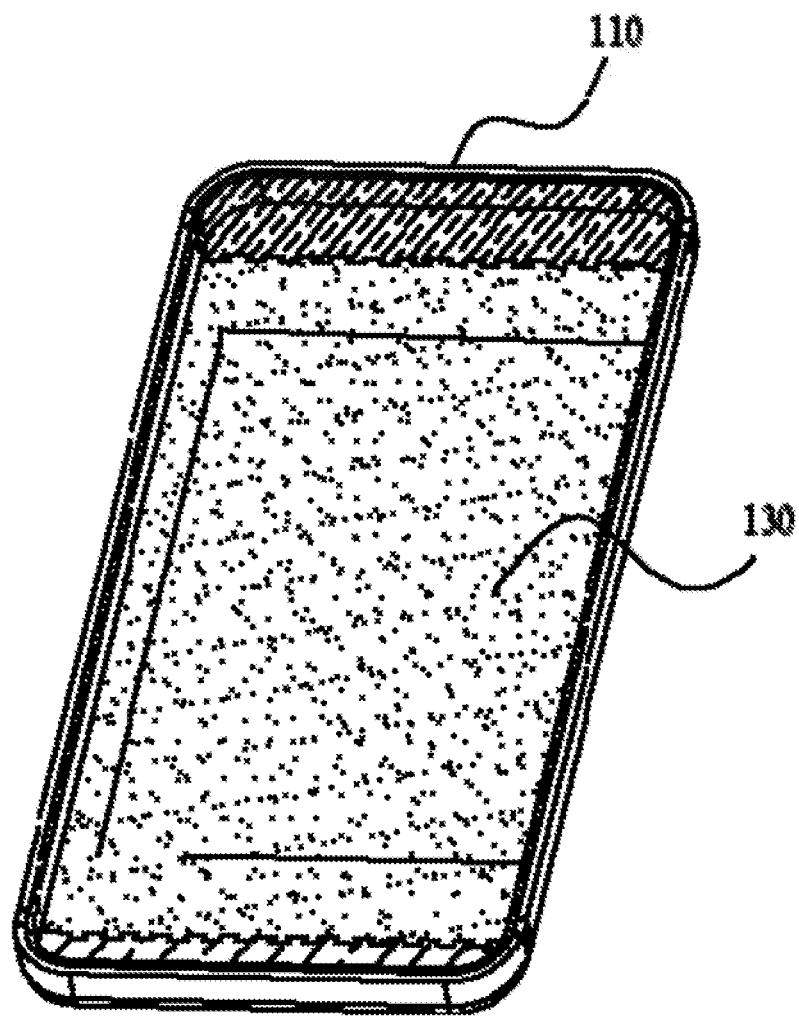
FIG. 8 illustrates a structural schematic diagram of a mobile terminal shell according to an embodiment of the present application.

According to the embodiments of the present application, as illustrated in FIG. 8, the method further includes: forming a fixing recess based on the reinforcing portion. According to the embodiments of the present application, the fixing recess is formed by the reinforcing portion, and it may be configured to accommodate a battery, a mother board, etc., and is advantageous in enhancing the mechanical properties of the shell without significantly increasing the overall thickness of the mobile terminal.

Figure 9:
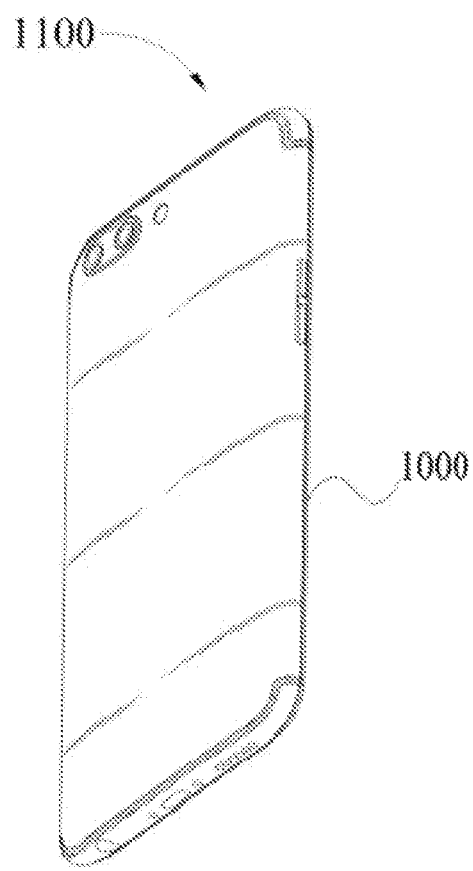
FIG. 9 illustrates a structural schematic diagram of a mobile terminal according to an embodiment of the present application.

In still another aspect of the present application, as illustrated in FIG. 9, the present application provides a mobile terminal. According to the embodiments of the present application, the mobile terminal may include the foregoing mobile terminal shell 100. Therefore, the mobile terminal has all the features and advantages of the foregoing mobile terminal shell, and details are not described herein again.

In the descriptions of the specification, the descriptions made with reference to terms "one embodiment", "another embodiment" or the like refer to that specific features, structures, materials or characteristics described in combination with the embodiment are included in at least one embodiment of the disclosure. In the specification, these terms are not always schematically expressed for the same embodiment or example. Moreover, the specific described features, structures, materials or characteristics may be combined in a proper manner in any one or more embodiments or examples. In addition, those skilled in the an may integrate and combine different embodiments or examples described in the specification and features of different embodiments or examples without conflicts. In addition, it is to be noted that terms "first" and "second" are only adopted for description and should not be understood to indicate or imply relative importance or implicitly indicate the number of indicated technical features.

The embodiments of the disclosure have been shown or described above. However, it can be understood that the above embodiments are exemplary and should not be understood as limits to the disclosure and those of ordinary skill in the art may make variations, modifications, replacements, transformations to the above embodiments within the scope of the disclosure.

The invention claimed is:

1. A mobile terminal shell, comprising:
  a body, formed of metal;
  a reinforcing portion for reinforcing a mechanical strength of the shell, provided on at least a part of the surface on an inner side of the body and formed of a first material; and
  an antenna slot, provided on the body and filled with a second material,
  wherein a mechanical strength of the first material is higher than a mechanical strength of the second material,
  wherein the first material comprises a first substrate and a first reinforcing agent, and
  the second material comprises a second substrate and a second reinforcing agent,
  the content of the second reinforcing agent in the second material is less than the content of the first reinforcing agent in the first material.

2. The mobile terminal shell according to claim 1, wherein the first material is formed on the body by nano molding technology.

3. The mobile terminal shell according to claim 1, wherein the second material is formed on the body by nano molding technology.

4. The mobile terminal shell according to claim 1, wherein each of the second material and the first material is formed by plastic.

5. The mobile terminal shell according to claim 1, wherein each of the second substrate and the first substrate comprises at least one of polybutylene terephthalate, polybutylene succinate, or polyamide.

6. The mobile terminal shell according to claim 1, wherein each of the second reinforcing agent and the first reinforcing agent comprises at least one of a glass fiber, a carbon fiber, or a carbon nanotube.

7. The mobile terminal shell according to claim 1, wherein, the content of the second substrate is present at 70 wt % to 90 wt % of the mass of the second material, and the content of the second reinforcing agent is present at 10 wt % to 30 wt % of the mass of the second material.

8. The mobile terminal shell according to claim 1, wherein the content of the first substrate is present at 40 wt % to 60 wt % the mass of the first material, and the content of the first reinforcing agent is present at 40 wt % to 60 wt % of the mass of the first material.

9. The mobile terminal shell according to claim 1, wherein the reinforcing portion covers the entire surface of a side of the body away from the antenna slot.

10. The mobile terminal shell according to claim 1, wherein the antenna slot penetrates throughout the body, the antenna slot is filled with the second material and the first material, and the first material is filled at a side of the antenna slot adjacent to the reinforcing portion.

11. The mobile terminal shell according to claim 1, further comprising:
a through hole, extending through the body and surrounded by the reinforcing portion.

12. The mobile terminal shell according to claim 1, further comprising:
a fixing recess, formed by the reinforcing portion.

13. A method for manufacturing a mobile terminal shell, comprising:
performing first nano molding processing on an inner side of a body, to form a reinforcing portion on the inner side of the body; and
performing second nano molding processing on an outer side of the body, to fill an antenna slot on the body,
wherein the first nano molding processing is performed by using a first material, and the second nano molding processing is performed by using a second material, a mechanical strength of the first material being higher than a mechanical strength of the second material, the first material comprising a first substrate and a first reinforcing agent, the second material comprising a second substrate and a second reinforcing agent, the content of the second reinforcing agent in the second material being less than the content of the first reinforcing agent in the first material.

14. The method according to claim 13, comprising:
pre-forming the antenna slot penetrating throughout the body on the body;
performing the first nano molding processing on the entire surface of said inner side of the body to form the reinforcing portion, and filling the first material in at least a part of the antenna slot; and
forming an accommodating space in one side of the antenna slot away from the reinforcing portion, and filling the antenna slot by the second nano molding processing.

15. The method according to claim 13, comprising:
filling the second material in the antenna slot on the body by the second nano molding processing; and
performing the first nano molding processing on one side of the body away from the second material, to form the reinforcing portion.

16. The method according to claim 13, wherein before performing the first nano molding processing, the method further comprises: forming a through hole in the body.

17. The method according to claim 16, comprising forming the reinforcing portion surrounding the through hole by the first nano molding processing.

18. The method according to claim 13, further comprising:
forming a fixing recess based on the reinforcing portion.

19. A mobile terminal, comprising a mobile terminal shell, the mobile terminal shell comprises:
a body, formed of metal;
a reinforcing portion for reinforcing a mechanical strength of the shell, provided on at least a part of the surface on an inner side of the body and formed of a first material; and
an antenna slot, provided on the body and filled with a second material,
wherein a mechanical strength of the first material is higher than a mechanical strength of the second material,
wherein the first material comprises a first substrate and a first reinforcing agent; and
the second material comprises a second substrate and a second reinforcing agent, the content of the second reinforcing agent in the second material is less than the content of the first reinforcing agent in the first material.

* * * * *